US006792693B2

United States Patent
Huang

(10) Patent No.: US 6,792,693 B2
(45) Date of Patent: Sep. 21, 2004

(54) WAFER DRYER SYSTEM FOR PRS WET BENCH

(75) Inventor: Hsing-Kai Huang, Sanchung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/266,962

(22) Filed: Oct. 8, 2002

(65) Prior Publication Data

US 2004/0064965 A1 Apr. 8, 2004

(51) Int. Cl.[7] .................................................. F26B 5/04
(52) U.S. Cl. ............................ 34/406; 34/107; 34/201; 134/102.3; 134/95.2
(58) Field of Search ........................... 34/406, 467, 73, 34/107, 201; 134/102.3, 95.2

(56) References Cited

U.S. PATENT DOCUMENTS 5,964,958 A * 10/1999 Ferrell et al. .................. 134/26
5,988,189 A * 11/1999 Mohindra et al. ......... 134/95.2
6,412,501 B1 * 7/2002 Onoda et al. .............. 134/95.2

* cited by examiner

Primary Examiner—Camtu T. Nguyen
(74) Attorney, Agent, or Firm—Tung & Associates

(57) ABSTRACT

A wafer dryer system which is suitable for drying rinse water from substrates in the event of a system malfunction or failure during or after rinsing of the substrates. The wafer dryer system typically includes a pair of drying chambers, each of which is fitted with at least one nitrogen gas inlet, at least one IPA gas inlet and an exhaust opening. A wafer boat which holds multiple wet wafers from an interrupted rinsing process typically in a wet bench system is placed in one of the chambers, after which the chamber is filled with hot nitrogen gas and mixed IPA gas to dry the wafers in the wafer boat. Upon resumption of operation of the wet bench system from which the wafers were taken or upon availability of a second wet bench system, the dried wafers are removed from the chamber for continued rinsing, as necessary.

16 Claims, 1 Drawing Sheet

WAFER DRYER SYSTEM FOR PRS WET BENCH

FIELD OF THE INVENTION

The present invention relates to wet benches for removing photoresist polymer particles from WIP (work-in-process) semiconductor wafers after a wet etching process in the semiconductor fabrication industry. More particularly, the present invention relates to a wafer dryer system for drying a WIP wafer in the event of wet bench malfunction or shutdown.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultra clean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

A schematic of a typical conventional wet bench system for removing photoresist polymers from semiconductor wafers is generally indicated by reference numeral 8 in FIG. 1. As a first step in the processing sequence, a set or lot of wafers (not shown), having previously been subjected to a photoresist process, is initially placed in a first acid wet clean chamber 10, in which the wafers are subjected to an acid solution, such as ACT690, to remove much of the polymer material from the wafer. Next, the wafers are transferred from the first acid wet clean chamber 10 to a second acid wet clean chamber 12, in which the wafers are again subjected to an acid such as ACT 690 to remove the remaining polymer residues from the wafers. The wafers are then transferred to a base clean chamber 14, in which a base such as NMP is applied to the wafers to neutralize the acid thereon. The wafers are then transferred to a QDR (quick dump rinse) chamber 16, and then to an ISO (isolation) bath chamber 18, in each of which the base previously applied to the wafers in the base clean chamber 14 is rinsed off the wafer using DI (deionized) water. Finally, the wafers are transferred to a spin dryer chamber 20, in which the wafers are rotated at high speeds to dry the rinse water from the wafers.

A problem commonly encountered in routine operation of the wet bench system 8 is that the system 8, including the wafer transfer mechanism thereof, may fail due to any of a number of reasons. When this occurs, the wafers in transit through the wet bench system 8, unable to progress to the spin dryer chamber 20, may be delayed at either the QDR chamber 16 or the ISO bath chamber 18. Accordingly, the metal components in the devices on the wafers must remain in contact with rinse water standing on the wafers for prolonged periods of time. The standing water on the wafers forms pits in the metal interconnects and other components on the wafers. Consequently, the yield of devices on the wafers is significantly reduced, and the affected wafers must be scrapped.

One technique which has been used to prevent prolonged exposure of the wafers at the rinsing step in the wet bench system 8 in the event of system malfunction or shutdown involves transferring the affected wafers to a separate wet bench system 8 for continuation of the drying process in the spin dryer chamber 20 thereof. However, in the event that the second wet bench system is loaded with wafers, there is a significant delay before the second system is available to receive and dry the affected rinsed wafers from the first system. Accordingly, a wafer dryer system is needed for drying wafers at the wafer rinsing stage in the event of a wet bench system failure or malfunction.

An object of the present invention is to provide a wafer dryer system for drying wet wafers in the event of system malfunction or shutdown.

Another object of the present invention is to provide a wafer dryer system which significantly enhances the yield of devices on a wafer.

Still another object of the present invention is to provide a wafer dryer system which prevents scrapping of wafers due to system malfunction in a wet bench system for removing photoresist polymers from substrates.

Yet another object of the present invention is to provide a wafer drying system which may be adapted to dry wafers in a variety of semiconductor fabrication processes.

A still further object of the present invention is to provide a wafer drying system for reducing or preventing formation of metal line pits in metal interconnects and other components in devices on a substrate.

Yet another object of the present invention is to provide a wafer drying system which reduces the costs associated with processing substrates in the fabrication of semiconductor integrated circuits.

SUMMARY OF THE INVENTION

In accordance with these and other objects and advantages, the present invention is generally directed to a wafer dryer system which is suitable for drying rinse water from substrates in the event of a system malfunction or failure during or after rinsing of the substrates. The wafer dryer system typically includes a pair of drying chambers, each of which is fitted with at least one nitrogen gas inlet, at least one IPA gas inlet and an exhaust opening. A wafer boat which holds multiple wet wafers from an interrupted rinsing process typically in a wet bench system is placed in one of the chambers, after which the chamber is filled with hot nitrogen gas and mixed IPA gas to dry the wafers in the wafer boat. Upon resumption of operation of the wet bench system from which the wafers were taken or upon availability of a second wet bench system, the dried wafers are removed from the chamber for continued rinsing, as necessary.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in drying WIP semiconductor wafers in the event of malfunction or shutdown of a wet bench system to prevent pit formation in the metal components of the wafers. However, the invention is not so limited in application, and while references may be made to such semiconductor wafers and wet bench systems, the present invention is more generally applicable to drying substrates or objects in a variety of mechanical and industrial applications.

Figure 1:
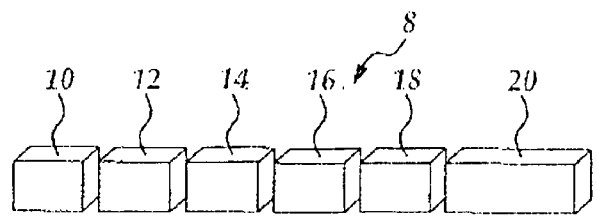
FIG. 1 is a schematic view illustrating typical components of a conventional wet bench system for removing photoresist polymers from substrates.
Figure 2:
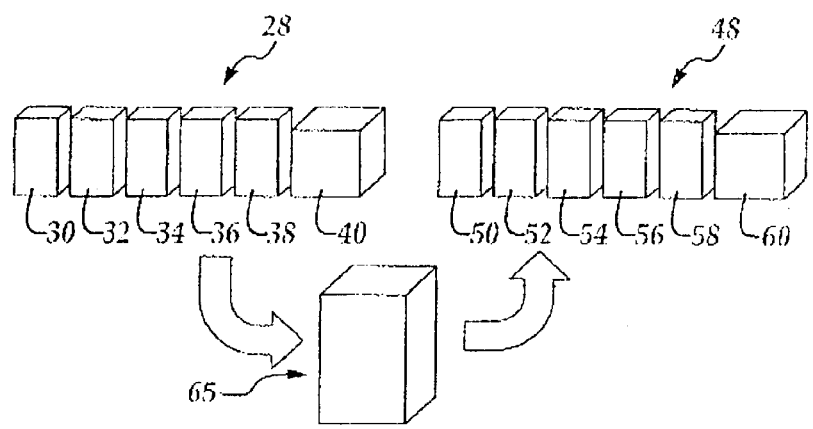
FIG. 2 is a schematic view illustrating two wet bench systems in typical implementation of a wafer dryer system of the present invention.
Figure 4:
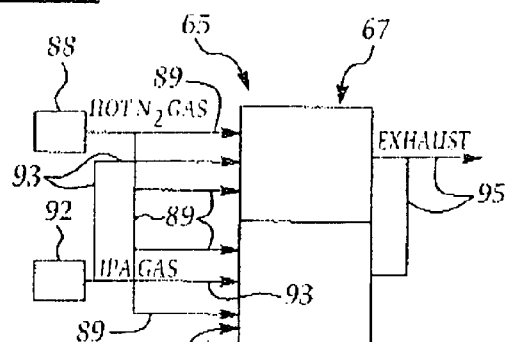
FIG. 4 is a typical piping schematic for a wafer dryer system of the present invention.
Figure 3:
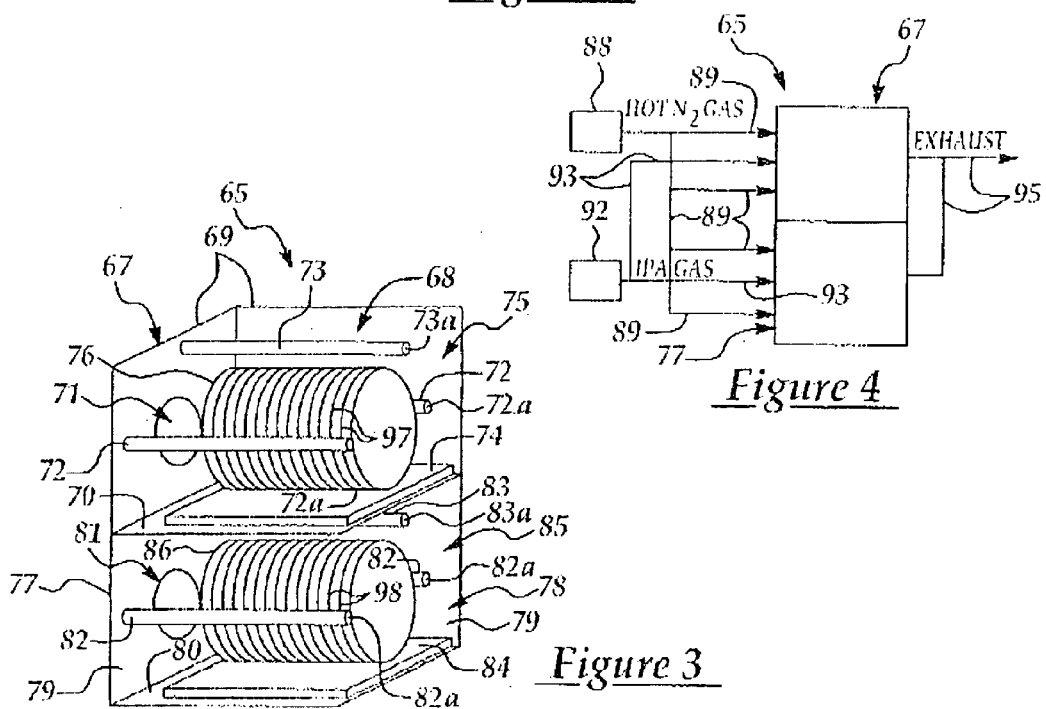
FIG. 3 is a perspective, partially schematic, view of a wafer dryer system of the present invention.

Referring initially to FIGS. 3 and 4 of the drawings, an illustrative embodiment of the wafer dryer system of the present invention is generally indicated by reference numeral 65 and typically includes an upper drying chamber 67 which may be separated from a lower drying chamber 77 by a partition 70. The upper drying chamber 67 includes a chamber wall 69 which defines a chamber interior 68 and includes a chamber opening 75 through which a wafer boat 76 loaded with multiple, typically twenty-five, WIP wafers 97 may be placed for drying in the chamber interior 68, as hereinafter further described. A chamber door (not shown) may be provided for closing the chamber opening 75. A suitable wafer support 74 typically rests on the partition 70 for supporting the wafer boat 76 in the chamber interior 68. A pair of nitrogen gas inlet conduits 72, each of which is connected to an exterior nitrogen gas source 88 through nitrogen gas piping 89, as shown in FIG. 4, extends into the chamber interior 68, typically on opposite sides of an exhaust opening 71 provided in the chamber wall 69. A nitrogen gas inlet opening 72a may be provided in the extending end of each nitrogen gas inlet conduit 72 for discharging nitrogen gas from the conduit 72 into the chamber interior 68. Alternatively, one or more of the inlet openings 72a may be provided along the length of each conduit 72. An IPA gas inlet conduit 73, connected to an exterior IPA gas source 92 through IPA gas piping 93, in like manner extends into the chamber interior 68, and may terminate in a IPA gas inlet opening 73a, or multiple inlet openings 73a may be provided along the length of the conduit 73 for discharging IPA gas into the chamber interior 68. The IPA gas inlet conduit 73 may extend into the chamber interior 68 between the nitrogen gas inlet conduits 72 and above the exhaust opening 71, as shown. The exhaust opening 71 is provided in the chamber wall 69 typically opposite the chamber opening 75, and is connected to exhaust piping 95, as shown in FIG. 4, for the removal of nitrogen gas and IPA gas from the chamber interior 68 during or after the drying process.

As further shown in FIG. 3, the lower drying chamber 77 may have the same design and components as the upper drying chamber 67, including a chamber wall 79 which defines a chamber interior 78 and has a chamber opening 85 through which a wafer boat 86 loaded with multiple, typically twenty-five, WIP wafers 98 may be placed for drying in the chamber interior 78, as hereinafter further described. A suitable wafer support 84 typically rests on a base 80 for supporting the wafer boat 86 horizontally in the chamber interior 78. A pair of nitrogen gas inlet conduits 82, each of which is connected to the nitrogen gas source 88 through the nitrogen gas piping 89, as shown in FIG. 4, extends into the chamber interior 78 for discharging nitrogen gas into the chamber interior 78. The nitrogen gas inlet conduits 82 may extend into the chamber interior 78 on opposite sides of an exhaust opening 81 provided in the chamber wall 79. A nitrogen gas inlet opening 82a may be provided in the extending end of each nitrogen gas inlet conduit 82 for discharging nitrogen gas from the conduit 82 into the chamber interior 78. Alternatively, one or more of the discharge openings 82a may be provided along the length of each conduit 82. An IPA gas inlet conduit 83, connected to the IPA gas source 92 through the IPA gas piping 93, in like manner extends into the chamber interior 78 for discharging IPA gas into the chamber interior 78, and may terminate in a IPA gas inlet opening 83a, or the openings 83a may be provided along the length of the conduit 83 for discharging IPA gas into the chamber interior 78. The exhaust opening 81 is provided in the chamber wall 79 typically opposite the chamber opening 85, and is connected to the exhaust piping 95, as shown in FIG. 4, for the removal of nitrogen gas and IPA gas from the chamber interior 78 after the drying process.

The wafer dryer system 65 shown in FIGS. 3 and 4 has been described as having an upper drying chamber 67 disposed on top of a lower drying chamber 77. However, it is understood that the drying chambers 67, 77 may alternatively be disposed in horizontally, rather than vertically, adjacent relationship to each other in the wafer dryer system 65. Furthermore, it is understood that the nitrogen gas inlet conduits 72 and the IPA gas inlet conduit 73 of the upper drying chamber 67, as well as the nitrogen gas inlet conduits 82 and the IPA gas inlet conduit 83 of the lower drying chamber 77, may have any suitable alternative arrangement than that described above and shown in FIG. 3.

In typical operation of the wafer dryer system 65 of the present invention, multiple lots of semiconductor wafers are simultaneously processed in each of two wet bench systems 28, 48 after the wafers are subjected to photoresist processing, in conventional fashion. The first wet bench system 28 includes a first acid wet clean chamber 30; a second acid wet clean chamber 32; a base clean chamber 34; a QDR (quick dump rinse) chamber 36; an ISO (isolation) bath chamber 38; and a spin dryer chamber 40. Likewise, the second wet bench system 48 includes a first acid wet clean chamber 50; a second acid wet clean chamber 52; a base clean chamber 54; a QDR chamber 56; an ISO bath chamber 58; and a spin dryer chamber 60. Accordingly, with regard to operation of the first wet bench system 28, wafers are initially placed typically by lot in the first acid wet clean chamber 30, in which the wafers are subjected to an acid solution, such as ACT690, to remove much of the polymer material from each of the wafers. Next, the wafers are transferred from the first acid wet clean chamber 30 to the second acid wet clean chamber 32, in which the wafers are again subjected to an acid such as ACT 690 to remove the remaining polymer residues from the wafers. The wafers are then transferred to a base clean chamber 34, in which a base such as NMP is applied to the wafers to neutralize the acid thereon. The wafers are then transferred to the QDR chamber 36, and then to the ISO bath chamber 38, in each of which the base previously applied to the wafers in the base clean chamber 34 is rinsed off the wafer using DI (deionized) water. Under normal circumstances, the wafers timely progress through the QDR chamber 36 and the ISO bath chamber 38 to a spin dryer chamber 40, in which the wafers are rotated at high speeds to dry the rinse water from the wafers. Finally, the wafers are removed from the spin dryer chamber 40 and transferred to a separate processing tool (not shown) for further processing. Separate lots of wafers are similarly processed simultaneously during transit through the second wet bench system 48.

In the event that the first wet bench system 28 inadvertently shuts down or malfunctions, a first lot of wafers 97 (FIG. 3), loaded in a wafer boat 76, may initially be delayed in the QDR chamber 36, while a second lot of wafers 98, loaded in a wafer boat 86, may initially be delayed in the ISO chamber 38, of the wet bench system 28. The first lot of wafers 97 and the second lot of wafers 98 are typically wet and must be dried before standing DI water on the wafers 97, 98 forms pits in the metal interconnects and other components formed in the devices on the wafers 97, 98. Normally under such circumstances, the wafers 97, 98 are unloaded from the QDR chamber 36 and the ISO chamber 38, respectively, of the first wet bench system 28 and placed in the respective QDR chamber 56 and ISO chamber 58 of the second wet bench system 48 for continued DI water rinsing of the wafers 97, 98. However, under circumstances in which operation of the QDR chamber 56 and ISO chamber 58 of the second wet bench system 48 is in progress, transfer of the wet wafers 97, 98 to the QDR chamber 56 and ISO chamber 58 is delayed. Accordingly, the first lot of wafers 97 is transferred instead to the upper drying chamber 67, and the second lot of wafers 98 is transferred to the lower drying chamber 77, of the wafer dryer system 65. This is typically accomplished by sliding the first lot of wafers 97 and corresponding wafer boat 76 horizontally into the chamber interior 68 through the chamber opening 75, and sliding the second lot of wafers 98 and corresponding wafer boat 86 horizontally into the chamber interior 78 of the lower drying chamber 77 through the chamber opening 85. After the chamber openings 75, 85 are closed, the chamber interior 68 of the upper drying chamber 67 is filled with IPA gas by distributing the IPA gas from the IPA gas source 92 and through the exterior IPA gas piping 93 and the IPA gas inlet conduit 73 in the chamber interior 68, respectively. Simultaneously, the chamber interior 78 of the lower drying chamber 77 is filled with IPA gas by distributing the IPA gas from the IPA gas source 92, through the IPA gas piping 93 and into the chamber interior 78 through the IPA gas inlet conduit 83. The IPA gas in the chamber interior 68 of the upper drying chamber 67 and in the chamber interior 78 of the lower drying chamber 77 both dries DI water and removes many of the photoresist polymer and other particles remaining on the surfaces of the wafers 97, 98, respectively. Next, hot nitrogen gas, at a temperature of typically about 50° C. to about 70° C., is distributed from the nitrogen gas source 88 and into the chamber interior 68 of the upper cleaning chamber 67, through the nitrogen gas piping 89 and the respective nitrogen gas conduits 72 in the chamber interior 68 of the upper drying chamber 67. Simultaneously, some of the hot nitrogen gas is distributed from the nitrogen gas source 88 and into the chamber interior 78 of the lower cleaning chamber 77, through the nitrogen gas piping 89 and the respective nitrogen gas conduits 82 in the chamber interior 78 of the lower drying chamber 77. The hot nitrogen gas quickly dries the wafers 97 in the upper drying chamber 67 and the wafers 98 in the lower drying chamber 77. The hot nitrogen remains in the chamber interior 68 of the upper drying chamber 67 and in the chamber interior 78 of the lower drying chamber 77 to maintain the wafers 97, 98 in a dry condition until the QDR chamber 56 and the ISO chamber 58 of the second wet bench system 48 are available for continued rinsing of the wafers 97, 98, respectively. At that time, the IPA gas and nitrogen gas vapors in the chamber interior 68 of the upper drying chamber 67 and in the chamber interior 78 of the lower drying chamber 77 are evacuated from the respective chamber interiors 68, 78, through the exhaust opening 71 of the upper drying chamber 67 and the exhaust opening 81 of the lower drying chamber 77, respectively. The evacuated IPA gas and nitrogen gas vapors are directed to a suitable venting system through the exhaust piping 95. Finally, the wafer boat 76 holding the wafers 97 is removed from the upper drying chamber 67 and placed in the QDR chamber 56 of the second wet bench system 48 for continued rising of the wafers 97. In like manner, the wafer boat 86 holding the wafers 98 is removed from the lower drying chamber 77 and is placed in the ISO bath chamber 58 for continued rinsing of the wafers 98.

While the preferred embodiments of the invention have been described above, it will be recognized and understood that various modifications can be made to the invention and the appended claims are intended to cover all such modifications which may fall within the spirit and scope of the invention.

What is claimed is:

1. A dryer system for drying substrates, comprising:
   at least one drying chamber;
   a support provided in said at least one drying chamber for supporting the substrates;
   at least one IPA gas inlet opening provided in said at least one drying chamber adjacent to said support for distributing IPA gas into said at least one drying chamber; and
   at least one nitrogen gas inlet opening provided in said at least one drying chamber adjacent to said support for distributing nitrogen gas into said at least one drying chamber, said at least one nitrogen gas inlet opening comprising a pair of nitrogen gas inlet openings.

2. The dryer system of claim 1 wherein said at least one drying chamber comprises a first drying chamber and a second drying chamber.

3. The dryer system of claim 2 wherein said at least one nitrogen gas inlet opening comprises a pair of nitrogen gas inlet openings.

4. The dryer system of claim 1 further comprising at least one IPA gas inlet conduit extending into said at least one drying chamber and wherein said at least one IPA gas inlet opening is provided in said at least one IPA gas inlet conduit, and further comprising at least one nitrogen gas inlet conduit extending into said at least one drying chamber and wherein said at least one nitrogen gas inlet opening is provided in said at least one nitrogen gas inlet conduit.

5. The dryer system of claim 4 wherein said at least one nitrogen gas inlet conduit comprises a pair of nitrogen gas inlet conduits.

6. The dryer system of claim 4 wherein said at least one drying chamber comprises a first drying chamber and a second drying chamber.

7. The dryer system of claim 6 wherein said at least one nitrogen gas inlet conduit comprises a pair of nitrogen gas inlet conduits.

8. A dryer system for drying substrates, comprising:
   at least one drying chamber having an exhaust opening, said at least one drying chamber comprises a first drying chamber and a second drying chamber;
   a support provided in said at least one drying chamber for supporting the substrates;
   an IPA gas inlet conduit extending into said at least one drying chamber adjacent to said support for distributing IPA gas into said at least one drying chamber; and
   a pair of nitrogen gas inlet conduits extending into said at least one drying chamber adjacent to said support for distributing nitrogen gas into said at least one drying chamber.

9. The dryer system of claim 8 further comprising a partition separating said first drying chamber from said second drying chamber and wherein said support comprises a first support provided in said first drying chamber and a second support provided in said second drying chamber, and where in said first support is carried by said partition.

10. The dryer system of claim 8 wherein said pair of nitrogen gas inlet conduits extends into said at least one drying chamber on respective sides of said exhaust opening.

11. The dryer system of claim 10 wherein said at least one drying chamber comprises a first drying chamber and a second drying chamber.

12. The dryer system of claim 10 wherein said IPA gas inlet conduit extends into said at least one drying chamber between said pair of nitrogen gas inlet conduits.

13. A method drying substrates in the event of termination of operation of a processing system for the substrates, comprising the step of:
   providing a dryer system comprising at least one drying chamber, at least one IPA gas inlet opening provided in said at least one drying chamber, and at least one nitrogen gas inlet opening provided in said at least one drying chamber;
   removing the substrates from the processing system;
   placing the substrates in a substantially liquid-free environment in said at least one drying chamber;
   exposing the substrates to IPA gas by introducing IPA gas into said at least one drying chamber through said at least one IPA gas inlet opening; and exposing the substrates to high-temperature nitrogen gas by introducing high-temperature nitrogen gas into said at least one drying chamber through said at least one nitrogen gas inlet opening.

14. The method of claim 13 wherein said high-temperature nitrogen gas is 50° C. to about 70° C.

15. The method of claim 13 wherein said at least one drying chamber comprises a first drying chamber and a second drying chamber.

16. The method of claim 13 wherein said dryer system further comprise a pair of nitrogen gas inlet conduits extending into said at least one drying chamber and an IPA gas inlet conduit extending into said at least one drying chamber, and wherein said at least one nitrogen gas inlet opening comprises a nitrogen gas inlet opening provided in each dot said pair of nitrogen gas inlet conduits, and said at least one IPA gas inlet opening comprises an IPA gas inlet opening provided in said IPA gas inlet conduit.

* * * * *